United States Patent
Han et al.

(10) Patent No.: US 6,562,688 B2
(45) Date of Patent: May 13, 2003

(54) METHOD OF MANUFACTURING A BIPOLAR DEVICE

(75) Inventors: Tae-Hyeon Han, Taejon (KR); Byung Ryul Ryum, Taejon (KR); Soo-Min Lee, Taejon (KR); Deok-Ho Cho, Taejon (KR)

(73) Assignee: ASB, Inc., Taejon (KR)

( * ) Notice: Subject to any disclaimer, the term of this patent is extended or adjusted under 35 U.S.C. 154(b) by 0 days.

(21) Appl. No.: 09/747,761

(22) Filed: Dec. 21, 2000

(65) Prior Publication Data

US 2002/0079510 A1 Jun. 27, 2002

(51) Int. Cl.[7] .............................................. H01L 21/331
(52) U.S. Cl. ........................................ 438/320; 438/364
(58) Field of Search ................................. 438/364, 312, 438/320, 341, 349

(56) References Cited

U.S. PATENT DOCUMENTS

| | | | | |
|---|---|---|---|---|
| 5,242,843 A | * | 9/1993 | Aina ........................... | 438/319 |
| 5,696,007 A | * | 12/1997 | Ryum et al. ................. | 438/320 |
| 6,337,494 B1 | * | 1/2002 | Ryum et al. ................. | 257/197 |

\* cited by examiner

*Primary Examiner*—John F. Niebling
*Assistant Examiner*—Christopher Lattin
(74) *Attorney, Agent, or Firm*—Jacobson Holman PLLC

(57) ABSTRACT

Disclosed are a method for manufacturing a homojunction or heterojunction bipolar device and a structure of the bipolar device manufactured by the method. The method comprises steps of forming a collector on a substrate including a buried collector to be contacted with the buried collector and protruded in the form of an island; depositing a collector dielectric film on the substrate on which the collector is formed; removing a protruded portion of the collector dielectric film covering the substrate; depositing a first semiconductor electrode layer on the substrate including the collector protruded over the collector dielectric film and flatting a surface of the first semiconductor electrode to expose only the collector formed of a semiconductor material and the first semiconductor electrode; and growing a base thin film including one of silicon and silicon-germanium on the substrate on which only the semiconductor material is exposed, thereby preventing the non-uniformity of a thickness of the base thin film, a contain rate of an impurity and a germanium distribution by the loading effect.

5 Claims, 8 Drawing Sheets

METHOD OF MANUFACTURING A BIPOLAR DEVICE

BACKGROUND OF THE INVENTION

1. Filed of the Invention

The present invention relates to a method of manufacturing a silicon-germanium heterojunction bipolar transistor (SiGe HBT) and a structure thereof, and more particularly, to a method of forming a base layer including silicon-germanium by epitaxial growth and a structure of the SiGe HBT in a heterojunction bipolar transistor used as a high-speed device.

2. Description of the Prior Art

Presently, due to continuous research and development in the field of electronics and telecommunications, optical transmission at a transmission rate of 10 Gbps or more is practicable using a high-speed device of 60 GHz class or more. In near feature, it is expected that a 20–30 Gbps IC for the optical transmission will be developed using the high-speed device of 100 GHz and an optical transmission system of few hundred Gbps class will be commercialized. Thus, an era of personal telecommunication using moving images will be opened soon. In the field of a radio communication terminal such as a personal mobile communication and GPS (global positioning system) terminal, it is essentially required to be much thinner, lighter, and, as the same time, multi-functionalized with lower power consumption. Therefore, RF (radio frequency) components, which have a problem in their size due to a large occupancy rate, should be formed into an IC. By a development of hybrid IC technology and MMIC (monolithic microwave integrated circuit) technology, the RF components may be formed into the IC, and the quality of the terminal and system is improved.

As one of the silicon bipolar devices, the SiGe HBT in which silicon-germanium is used as a base layer has a high operating speed of 100 GHz or more, and is in the limelight as an advanced high-speed device. The SiGe HBT device employs almost all the existing silicon process as it is and forms the base layer having a thin thickness of 0.02 m with the silicon-germanium using the epitaxial growth. Since the base layer (about 0.02 m) to be thinner than that of a conventional junction transistor is formed by the epitaxial growth using the silicon-germanium having a smaller band gap than silicon, there is some advantage to obtain a high current gain and operating speed with lower power consumption.

In the existing silicon bipolar device technology, Siemens and Daimler-Benz in Germany and IBM and HP in US have mainly developed. Meanwhile, in research and development of the SiGe HBT, IBM, Daimler-Benz, and NEC and so forth has mainly developed. A conventional method of manufacturing the SiGe HBT and structure thereof is as follows. FIG. 1 shows a cross-sectional view of a conventional heterojunction transistor defining a collector area by LOCOS (local oxidation of silicon) method.

Ion-implanting an n type dopant in a p– type silicon substrate 1 forms a buried collector 11. Depositing n– type silicon on an entire face of the substrate, in which the buried collector is formed, forms a collector thin film. On of the collector thin film, an anti-oxidising dielectric film as a mask covers a collector area and a collector sinker area. Then, the silicon exposed through the mask is locally oxidised by the LOCOS method to form a collector dielectric film 17. Therefore, on a portion of the buried collector 11, the collector thin film except the collector area and the collector sinker area is formed into the collector dielectric film (field oxide film) 17 formed of oxide silicon. An n– type dopant is implanted in the collector sinker area and then heat-treated at a high temperature to form a collector sinker 13. A silicon-germanium thin film for forming the base grows on the entire face of the substrate and then is patterned except the collector 15 and a portion of the collector dielectric film 17 around the collector 15 so as to form a base thin film. Formed on the collector 15 is a monocrystal base 25. The base 25 is extended laterally on the collector dielectric film 17. The base 25 on the collector dielectric film 17 is formed into a polycrystalline or amorphous base semiconductor electrode 23. On the entire face, there is deposited silicon oxide or silicon nitride to form an emitter dielectric film 37. The emitter dielectric film 37 is patterned so as to be opened a portion thereof corresponding to an active area of the base (25), thereby defining an emitter area. On the entire surface of the substrate, there is formed an emitter semiconductor electrode 39 formed of a polycrystalline silicon containing the n– type dopant such as arsenic and phosphorus, and so forth. Then, the emitter semiconductor electrode 39 is heat-treated to diffuse the n– type dopant on the base thin film and thus form an emitter 35. The silicon oxide or the silicon nitride is deposited on the entire surface of the substrate to form a passivation film 77. The passivation film 77 is patterned to form a contact window for exposing the emitter semiconductor electrode 39. Further, the passivation film 77 and the emitter dielectric film 37 are patterned to form the contact windows for exposing the base semiconductor electrode 23 and the collector sinker 13. Finally, a metal layer is deposited and then patterned to form a base terminal 81 contacted through the contact window with the base semiconductor electrode 23, an emitter terminal 83 contacted through the contact window with the emitter semiconductor electrode 39 and a collector terminal contacted through the contact window with the collector sinker 13 (FIG. 1).

In the LOCOS method as described above, between the collector dielectric film containing the silicon oxide and the collector area containing the n– type impurity, there is formed a clean boundary surface without any crystal defect. However, during the local oxidation of a part of the silicon layer, there is formed a bird's beak at a side of the boundary surface. The bird's beak is an obstacle to reducing a size of the device. Further, when the silicon-germanium thin film grows on the substrate of the silicon oxide film (collector dielectric film) and the silicon (collector), there is a problem that the silicon-germanium thin film selectively grows on only the silicon portion of the substrate.

In order to solve the problem, there is provided a selective epitaxial growth (SEG) method for manufacturing a high density and microminiature heterojunction transistor. FIG. 2 shows a cross-sectional view of a structure of a SiGe HBT manufactured by the SEG method. The manufacturing method will be described more fully.

Ion-implanting an n-type dopant in a p-type silicon substrate 1 forms a buried collector 11. Formed on an entire surface of the substrate, on which the buried collector is formed, is a collector dielectric film 17 of silicon oxide. After defining a part of the collector dielectric film 17, some portions of the collector dielectric film 17 corresponding to a collector area and a collector sinker area are removed so as to expose a portion of the buried collector 11. A pattern shape of the removed collector dielectric film 17 is formed to have a vertical sidewall. The collector area and the collector sinker area formed on a surface of the monocrystal buried collector exposed through the removed portion of the collector dielectric film 17 are filled with the monocrystal silicon by the SEG method. At this time, the monocrystal silicon excessively grows in the form of a mushroom to be higher than the collector dielectric film 17. Then, a protruded portion of the grown monocrystal silicon is removed by a chemical-mechanical polishing (CMP) method to flat the surface of the substrate. On the substrate on which a collector 15 and a collector sinker 13 are formed to have a vertical sidewall and a flat surface, silicon-germanium grows to form a base thin film. At this time, monocrystal silicon-germanium grows on the monocrystal silicon, i.e. the collector 15 to form a base 25 making a junction with the collector 15. Meanwhile, on the collector dielectric film 17 formed of the silicon oxide, polycrystalline or amorphous silicon-germanium grows. Formed on the base thin film is a base ohmic electrode layer 29 of a metal material in order to reduce a contact resistance. A portion of the base ohmic electrode layer 29 corresponding to the base 25 is removed to expose the base 25. And in order to prevent the base ohmic electrode layer 29 from being electrically contacted with an emitter to be formed, silicon oxide or silicon nitride is deposited on the emitter dielectric film 37. Then, the emitter dielectric film 37, the base ohmic electrode layer 29 and the base thin film are pattered to define the base 25, the base semiconductor electrode 23 and the base ohmic electrode layer 29. At this time, the collector sinker 13 is exposed. Preferably, on outer sides of the emitter dielectric film 37, the base ohmic electrode 29 and the base thin film etched by the patterning process, there is formed a sidewall dielectric film 97. The emitter dielectric film 37 is patterned so that a portion thereof corresponding to a center portion of the base 25 is removed to expose the base 25. Then, polycrystalline silicon containing an impurity is deposited and patterned to from an emitter semiconductor electrode 39 contacted with the exposed base 25 and a collector semiconductor electrode 19 contacted with the collector sinker 13. By a heat treatment process, the impurity in the emitter semiconductor electrode 39 is diffused to an upper portion of the base 25 to form an emitter 35. The silicon oxide or the silicon nitride is deposed on the entire surface of the substrate to form a passivation film 77. The passivation film 77 is patterned to form a contact window for exposing the emitter semiconductor electrode 39. And, the passivation film 77 and the emitter dielectric film 37 are patterned to form a contact window for exposing the base ohmic electrode 29. By sputtering a metal, there are formed a base terminal 81 contacted with the base ohmic electrode 29, an emitter terminal 83 contacted with the emitter semiconductor electrode 39 and a collector terminal 85 contacted with the collector semiconductor electrode.

In the conventional fabricating method described above, there is a problem in the selective epitaxial growth method for forming the collector 15 and the collector sinker 13. When the monocrystal silicon grows in a well-shaped space having the vertical sidewall formed by the etching process, a boundary surface with the silicon oxide sidewall has a very rough crystal structure. At the boundary surface between the collector 15 and the collector dielectric film 17, there is formed a defective area through which a carrier is freely passed. As a result, leakage current is generated from the base to the collector area, thereby lowering a quality of a product.

Further, in the conventional method such as the LOCOS method and the epitaxial growth method, when forming the base thin film, there is a problem that a thickness of the base thin film is not formed to be uniform. The base thin film is formed on the collector and the collector dielectric film by the epitaxial growth. On the surface of the substrate on which the crystal growth is performed, there are distributed mainly the silicon oxide and intermittently the monocrystal silicon. In this situation, if the base thin film grows, it is difficult to uniformly form the thickness of the thin film, the distribution content of the germanium and the concentration of the impurity due to loading effect.

SUMMARY OF THE INVENTION

Accordingly, it is an object of the present invention to provide a heterojunction transistor in which the problems inherent in the conventional transistor manufactured by the selective epitaxial growth method proper to reducing of a scale are solved, thereby providing a high operation speed and a high quality of a product, and a manufacturing method thereof.

It is other object of the present invention to provide a method of manufacturing a bipolar device by the heterojunction using the silicon-germanium as a base layer or the homojunction using the silicon as the base layer, which prevents a leakage current between the collector and the base by a defect at a boundary surface between the dielectric film and the collector inherent in the selective epitaxial growth method, and a structure of the transistor fabricated by the method.

It is another object of the present invention to provide a fabricating method for reducing the loading effect generated when a semiconductor material containing the SiGe grows on a surface containing the silicon and the dielectric film to form a base layer, and a structure of the transistor fabricated by the method.

According to the present invention, there is provided a method of manufacturing a bipolar device, comprising steps of forming a collector on a substrate including a buried collector to be contacted with the buried collector and protruded in the form of an island; depositing a collector dielectric film on the substrate on which the collector is formed; removing a protruded portion of the collector dielectric film covering the substrate; depositing a first semiconductor electrode layer on the substrate including the collector protruded over the collector dielectric film and flatting a surface of the first semiconductor electrode to expose only the collector formed of a semiconductor material and the first semiconductor electrode; and growing a base thin film including one of silicon and silicon-germanium on the substrate on which only the semiconductor material is exposed.

According to the present invention, there is also provided a bipolar device, comprising a substrate including a buried collector; a collector contacted with the buried collector and protruded in the form of an island; a collector dielectric film extended to a side portion of the collector and formed on the substrate; a first base semiconductor electrode extended to the side portion of the collector to have the same flat surface as an upper surface of the collector and formed on the collector dielectric film; a base including one of silicon-germanium and silicon formed on the collector; and a second base semiconductor electrode extended to a side portion of the base and formed on the first base semiconductor electrode to include one of the silicon-germanium and the silicon.

IN THE DRAWINGS

DETAILED DESCRIPTION OF THE PREFERRED EMBODIMENTS

The objects, characteristics and advantages of the above-described invention will become more apparent by describing the preferred embodiments thereof with reference to the accompanying drawings.

First Embodiment

Figure 1:
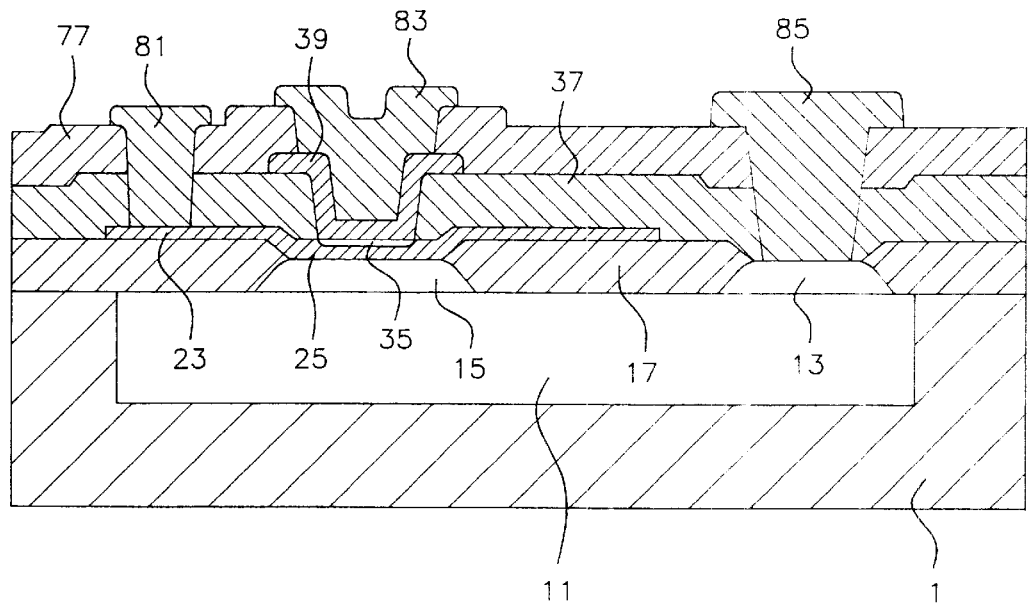
FIG. 1 is a cross-sectional view of a structure of a conventional silicon-germanium heterojunction bipolar transistor manufactured by LOCOS method.
Figure 2:
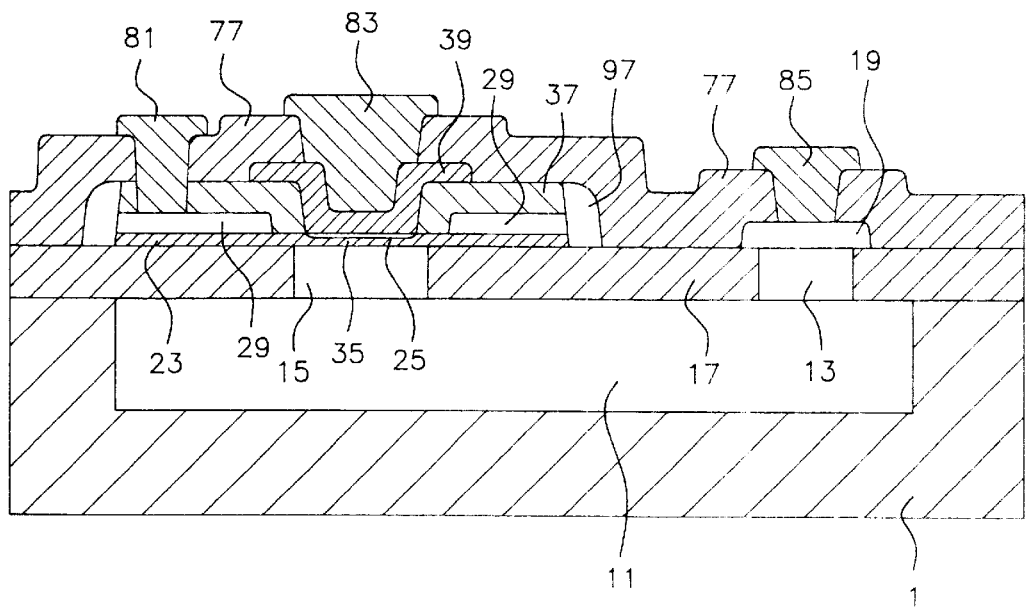
FIG. 2 is a cross-sectional view of a structure of a conventional silicon-germanium heterojunction bipolar transistor manufactured by SEG method.
Figure 3A:
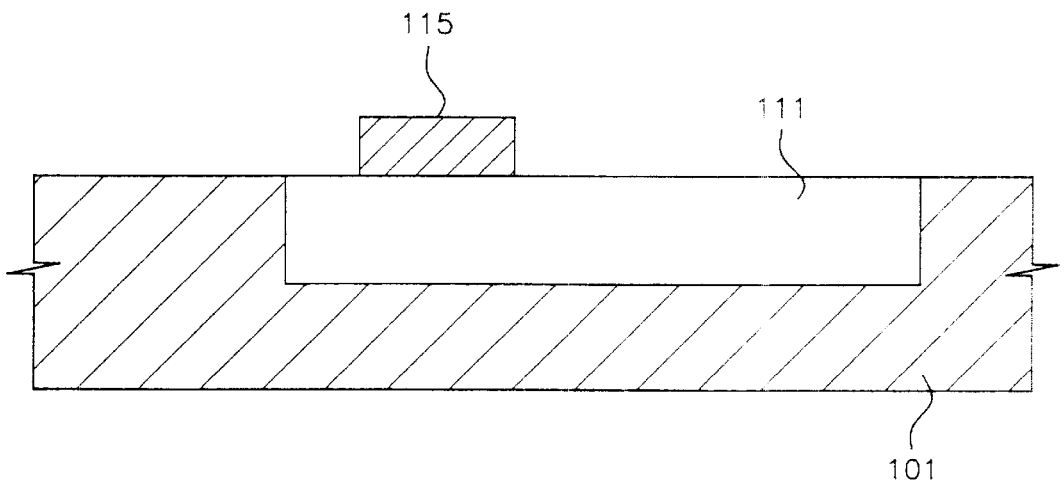
FIGS. 3a to 3o are cross-sectional views showing a method of manufacturing a silicon-germanium heterojunction bipolar transistor according to a first embodiment of the present invention.
Figure 3B:
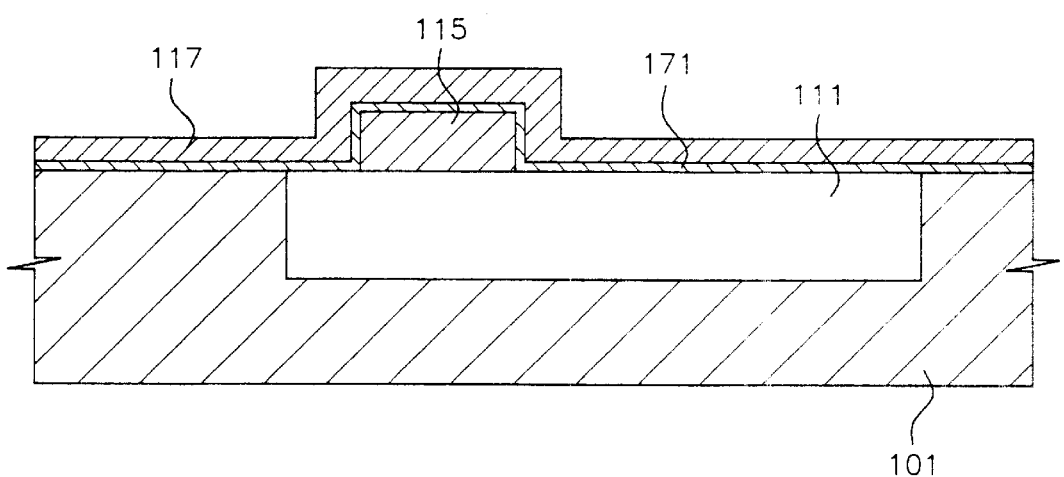
Figure 3C:
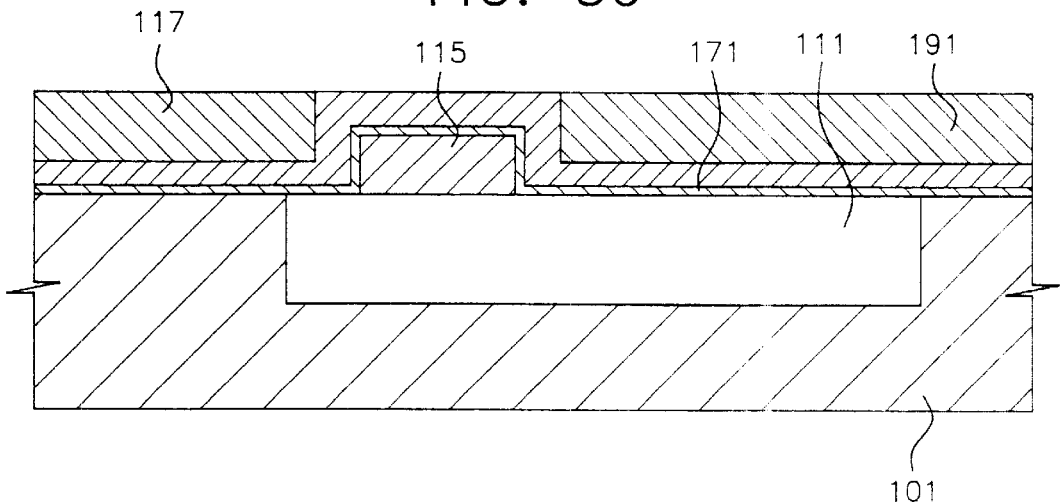
Figure 3D:
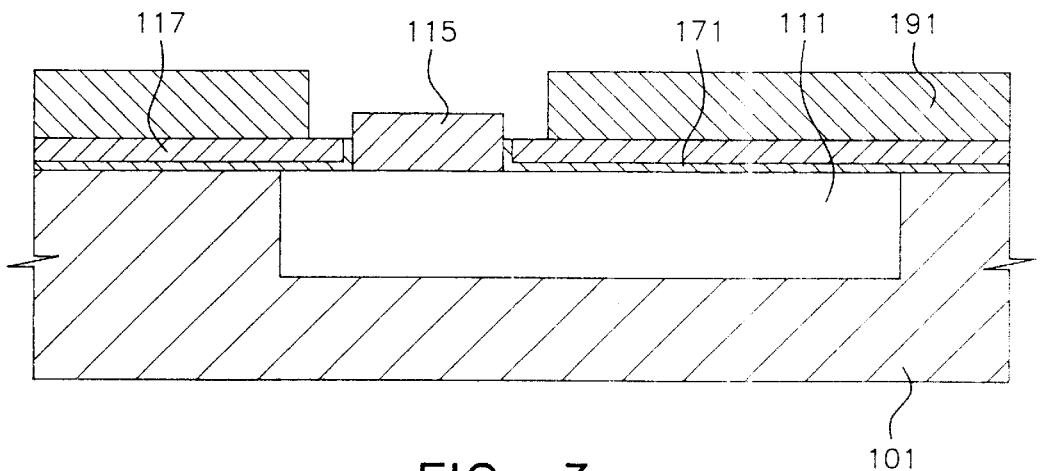
Figure 3E:
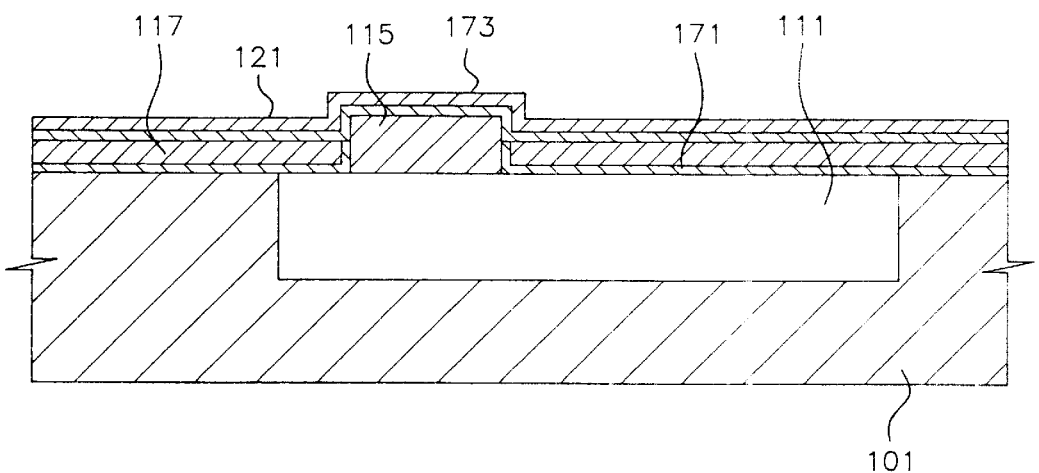
Figure 3F:
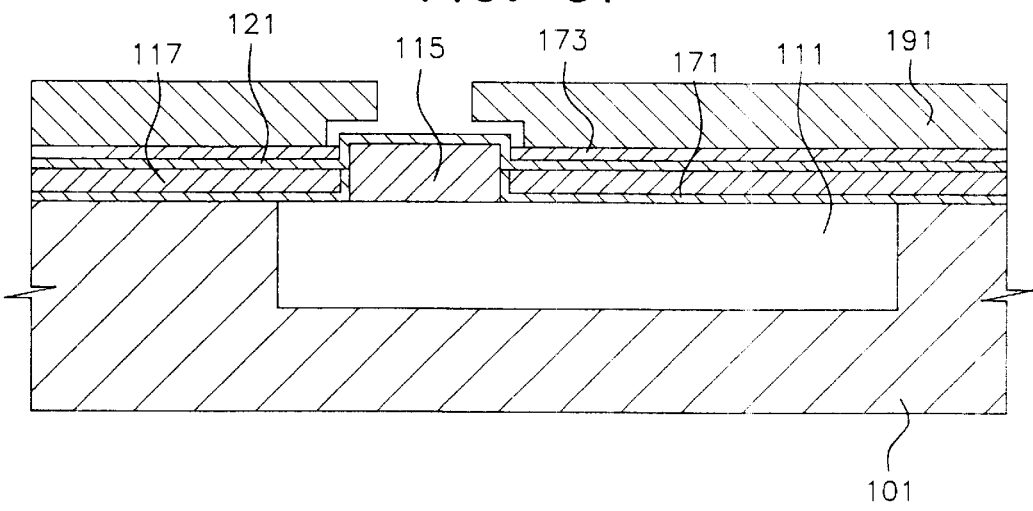
Figure 3G:
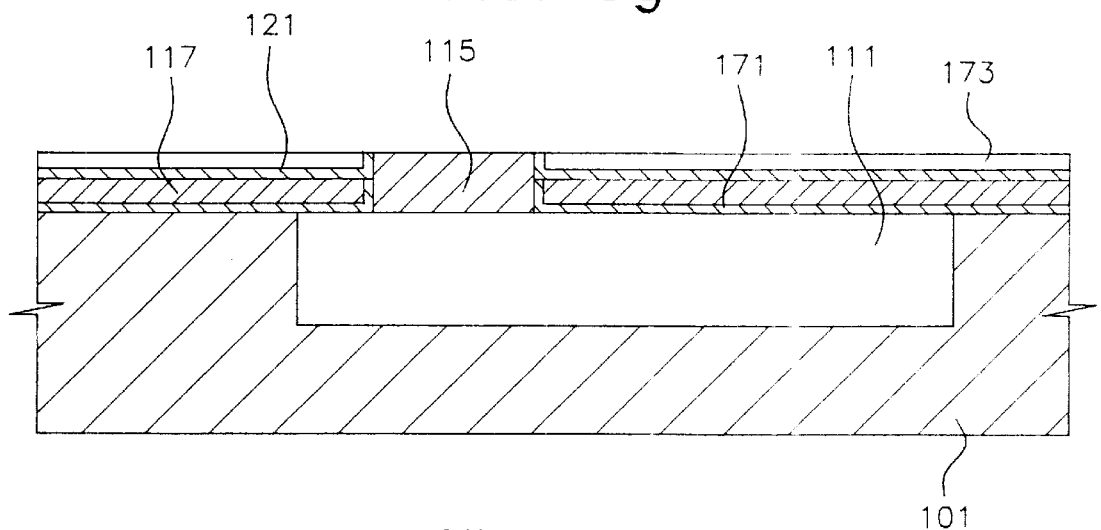
Figure 3H:
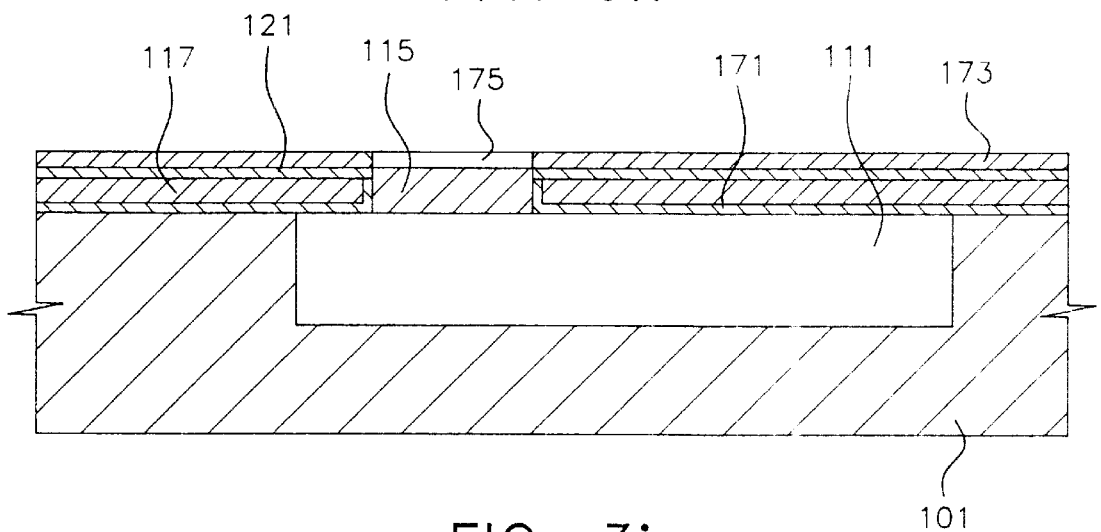
Figure 3I:
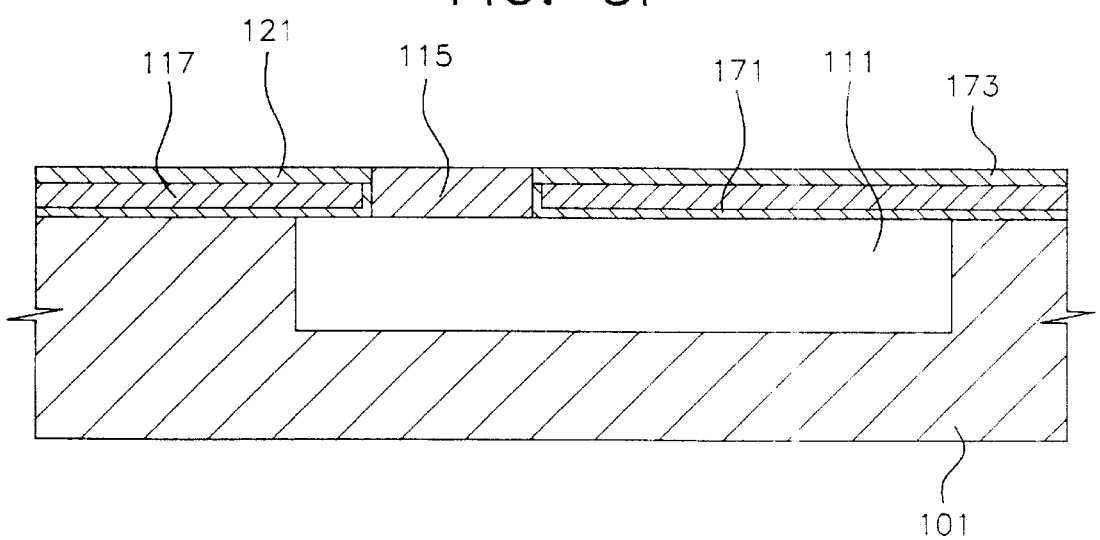
Figure 3J:
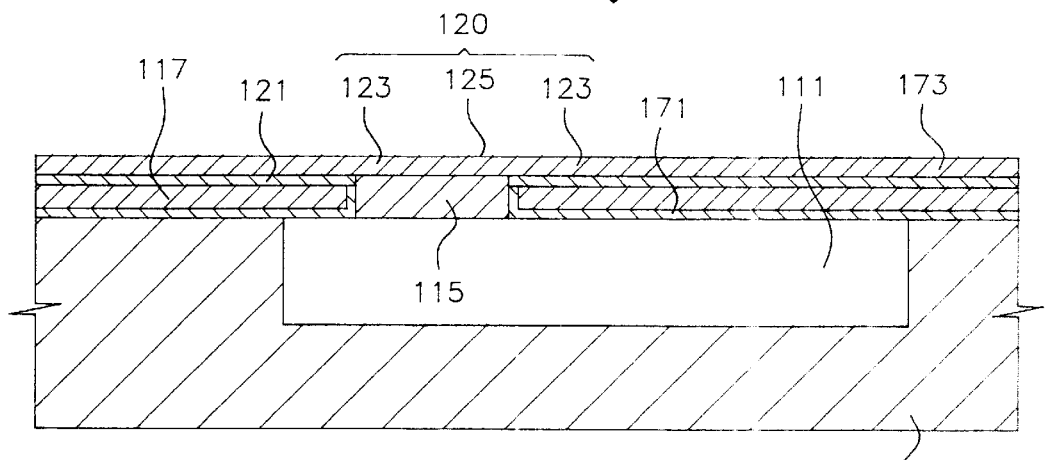
Figure 3K:
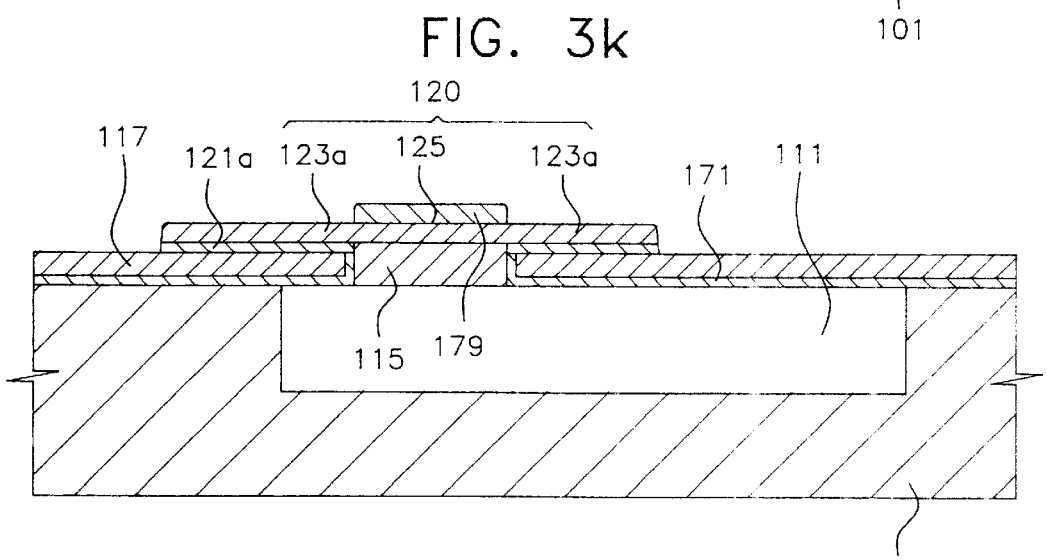
Figure 3L:
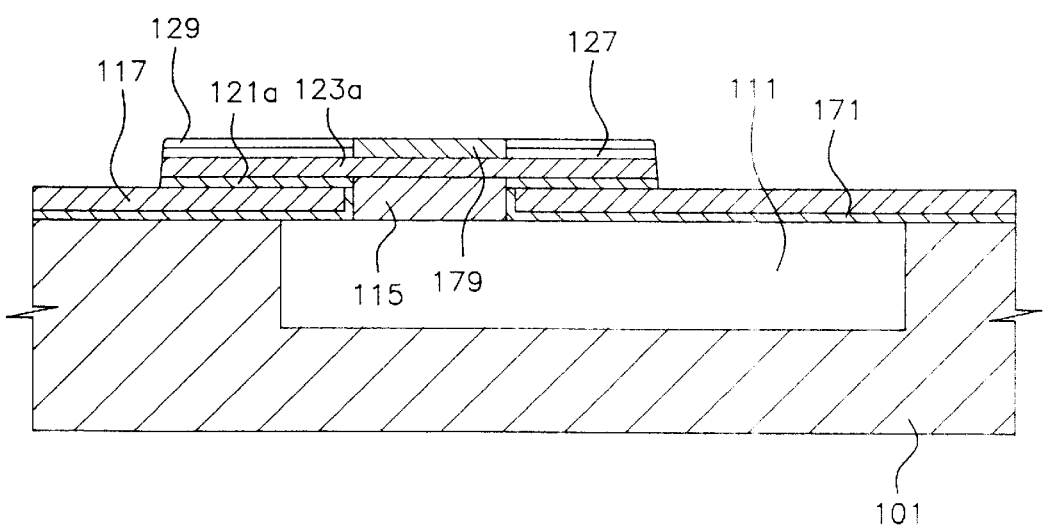
Figure 3M:
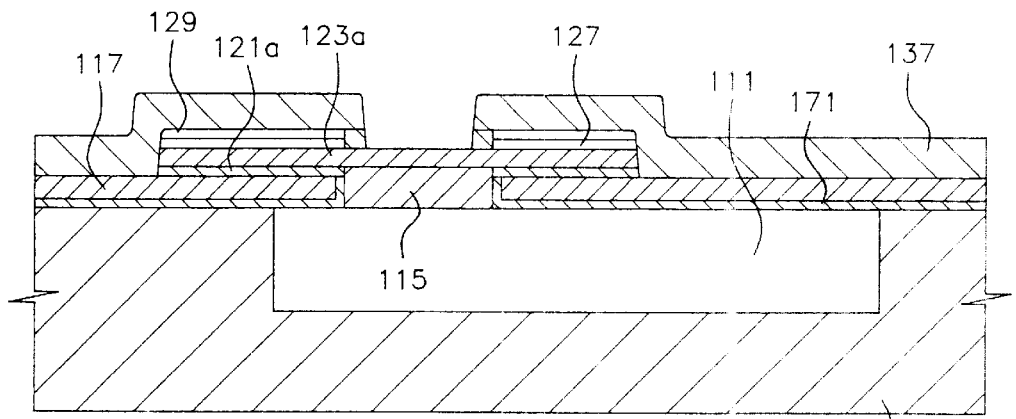
Figure 3N:
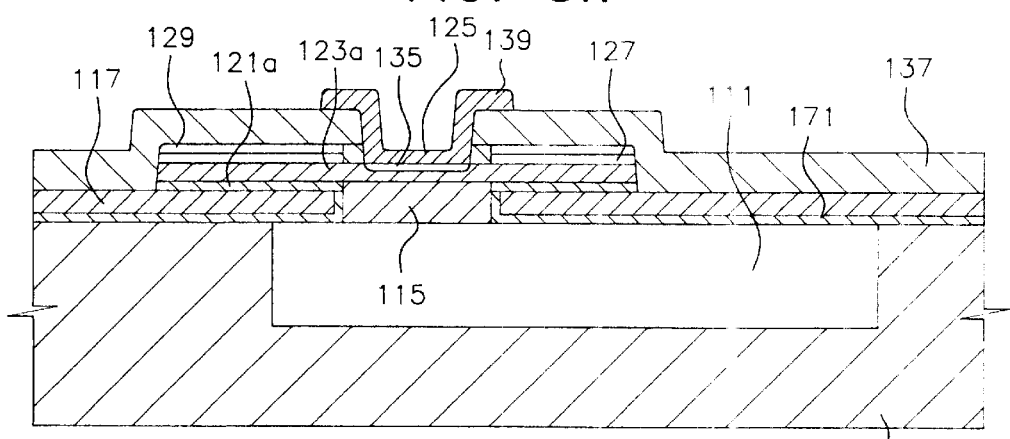
Figure 3O:
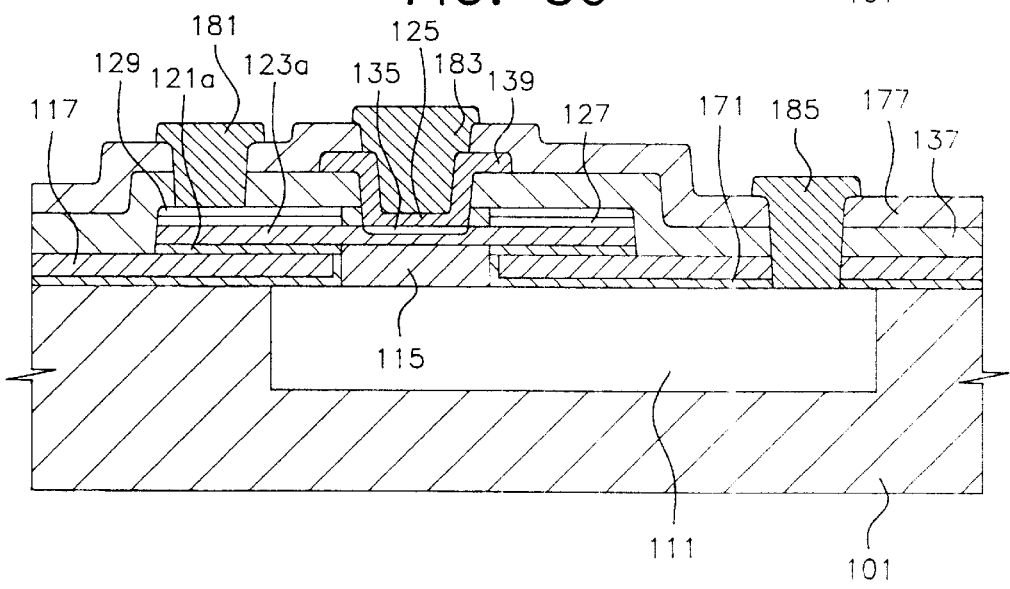

FIGS. 3a to 3o are cross-sectional views showing a method of manufacturing a silicon-germanium heterojunction bipolar transistor according to a first embodiment of the present invention.

Ion-implanting an n− type dopant such as arsenic or phosphorus in a p− type silicon substrate 101 forms a n+ type buried collector 111. An n− type semiconductor material grows by epitaxial growth method on an entire surface of the substrate on which the buried collector 111 to from a collector thin film. The collector thin film is patterned by a photolithography and an etching and forms an n− type collector 115 on the buried collector 111 (FIG. 3a).

A thin silicon oxide having a thickness of 50nm is thermally grown as a field oxide film 171. On the field oxide film 171, a low temperature silicon oxide film is deposited to form a collector dielectric film 117. Therefore, the field oxide film 171 and the collector dielectric film 117 are stacked on the surface of the substrate on which the collector 115 is protruded (FIG. 3b).

A photoresist 191 is coated on the substrate 101 and a coated surface is flatted by etch-back process. At this time, the flatting process is performed on the basis of a height of the protruded collector 115 so that a surface of the collector dielectric film 117 formed on the collector 115 is exposed (FIG. 3c).

The exposed collector dielectric film 117 is removed by a wet etching process so that the collector 115 is protruded as high as a difference between a thickness of the collector 115 and a total thickness of the field oxide film 171 and the collector dielectric film 117 (FIG. 3d).

Then, the remaining photoresist 191 is completely removed. On the surface of the substrate, p+ type polysilicon is deposited to form a first semiconductor electrode layer 121. A silicon oxide film 173 is deposited on the first semiconductor electrode layer 121. At this time, it is preferable that a total thickness of the first semiconductor electrode layer 121 and the silicon oxide film 173 is adjusted to be almost the same as the thickness of the collector 115 protruded over the field oxide film 171 and the collector dielectric film 117 (FIG. 3e).

The photoresist 191 is coated on the silicon oxide film 173. An opening is formed on the photoresist 191 to expose the silicon oxide film 173 covering the collector area. An etching process removes the silicon oxide film 173 exposed through the opening of the photoresist 191. At this time, the etching process is controlled to remove only a portion of the silicon oxide film 173 covering the exposed portion of the collector 115 (FIG. 3f).

The remaining photoresist 191 is completely removed. Then, only a part of the first semiconductor electrode layer 121 is protruded over the silicon oxide film 173 positioned at the same height as the collector 115. The protruded first semiconductor electrode layer 121 is removed to expose the surface of the collector 115. Therefore, the surface of the collector 115 and a part of the first semiconductor electrode layer 121 enclosing the collector 115 are exposed through the silicon oxide film 173 (FIG. 3g).

The surface of the collector 115 and the part of the first semiconductor electrode layer 121 enclosing the collector 115 are selectively oxidized to form a thermal silicon oxide film 175 having the same thickness as the silicon oxide film 173 (FIG. 3h).

After that, the silicon oxide film 173 and the thermal silicon oxide film 175 are removed. Therefore, the surface of the collector 115 formed of the monocrystal silicon and the surface of the first semiconductor electrode layer 121 formed of the polysilicon contacted with an upper side of the collector 115 are uniformly exposed on the substrate (FIG. 3i).

On the substrate covered by only the silicon, there is formed a base thin film 120 by the epitaxial growth method. The base thin film 120 is comprised of a p+ type SiGe layer formed of the p+ type silicon-germanium and an i-Si layer formed of silicon not containing a dopant. Since the silicon-germanium grows in a state that only the silicon covers the substrate, the silicon-germanium can grow to have a uniform thickness. Further, a concentration of the dopant and a distribution content of the germanium is formed to be uniform. The monocrystal base thin film is grown on the collector 115 of the monocrystal silicon to be used as a base 125. The polycrystalline base thin film is grown on the first semiconductor electrode layer 121 of the polysilicon to be used as a second semiconductor electrode layer 123 (FIG. 3j).

The silicon oxide as a masking film 179 is provided on an active area of the base 125. At this time, it is preferable that the masking film 179 has the almost same size as the collector 115. The second semiconductor electrode layer 123 and the first semiconductor electrode layer 121 are equally patterned to define a second base semiconductor electrode 123a and a first base semiconductor electrode 121a (FIG. 3k).

A semiconductor material grows by the epitaxial growth method to form a third base semiconductor electrode 127. The semiconductor material is doped with boron on the second base semiconductor electrode 123a using the masking film 179 as a mask. By sputtering a metal such as Ti, a base ohmic electrode 129 is selectively formed on only the third base semiconductor electrode 127 (FIG. 3l).

Formed on the substrate is an emitter dielectric film 137 including a low temperature silicon oxide film or a silicon nitride (Si3N4) film. The emitter dielectric film 137 covering the base area and the masking film 179 are patterned to open an emitter area (FIG. 3m).

On the substrate in which the emitter area is opened, the n+ type polysilicon is deposited and patterned to form an emitter semiconductor electrode 139. And then, if a heat treatment process diffuses the impurity, the n-type impurity contained in the emitter semiconductor electrode 139 is diffused into the silicon layer formed on the most upper portion of the base thin film and form an emitter 135 (FIG. 3n).

On the substrate, a low temperature silicon oxide is provided to form a passivation film 177. There is formed a metal contact window for exposing a part of the buried collector 111, a part of the base ohmic electrode, and a part of the emitter semiconductor electrode 139. A metal such as Ti, Al, Cu, and Au is deposited an patterned to from a collector terminal 185 contacted with the buried collector 111, a base terminal 181 contacted with the base ohmic electrode 129 and an emitter terminal 183 contacted with the emitter semiconductor electrode 139 (FIG. 30).

Second Embodiment

As shown in FIG. 3b of the first embodiment, in case of coating the photoresist 191 on the collector dielectric film 117 in which the collector 115 is protruded and flatting the surface of the coated photoresist, the photoresist 191 should be formed to be very thick. It is difficult to form and flat the thickness of the photoresist in a real process. To solve the problem, there is provided a method as follows.

Figure 4A:
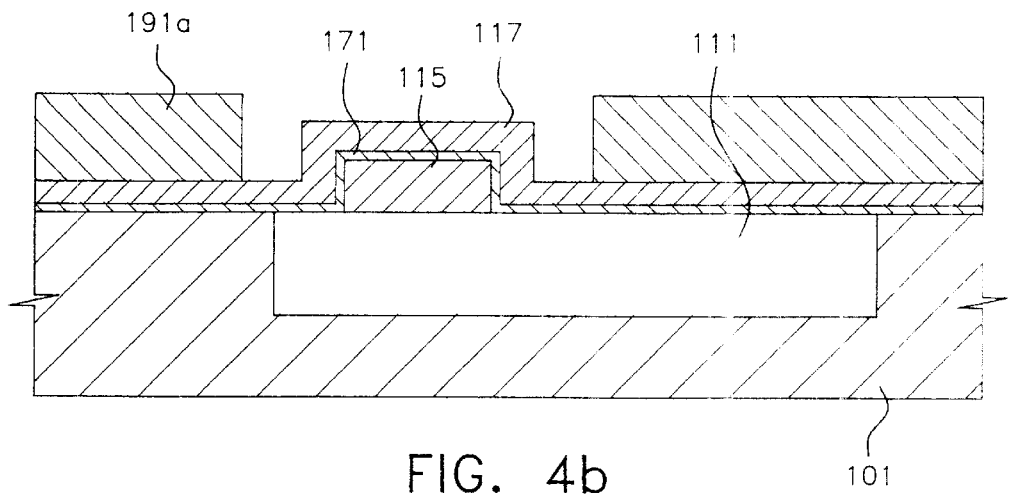
FIGS. 4a to 4c are cross-sectional views showing a method of manufacturing a silicon-germanium heterojunction bipolar transistor according to a second embodiment of the present invention.

The first photoresist 191a is formed to be thicker than the collector 115. Then, the protruded shape of the collector 115 is reflected to the coated first photoresist 191a. Therefore, the first photoresist 191a is also protruded according to shape of the collector 115. The protruded portion of the first photoresist 191a is removed so that the remaining portion of the first photoresist 191a is flat (FIG. 4a).

Figure 4B:
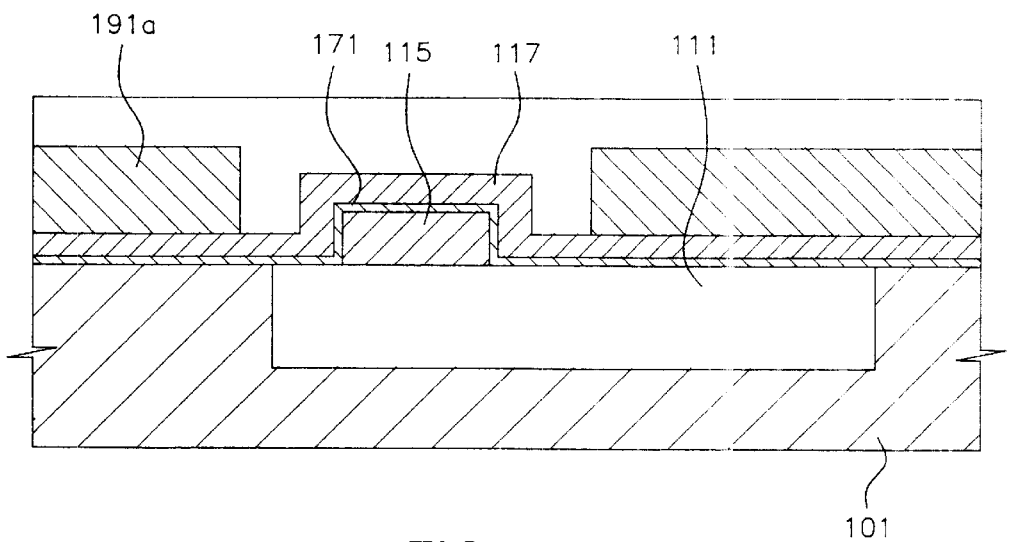

And then, a second photoresist 191b having a lower viscosity than the first photoresist 191a is coated on the remaining first photoresist 191a to fill a space formed by etching the first photoresist 191a and also cover the first photoresist 191a at a desired thickness (FIG. 4b).

Figure 4C:
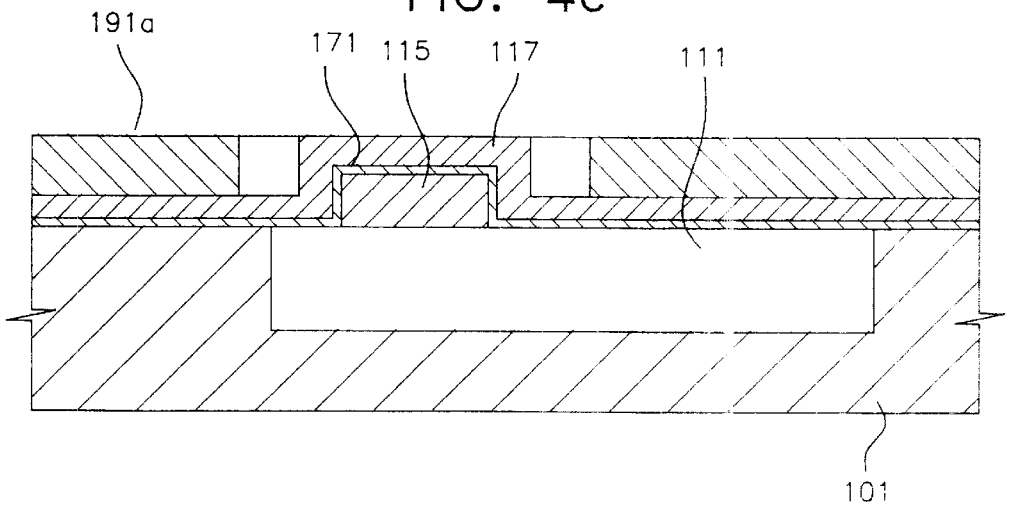

In this state, it is convenient to remove the second photoresist 191b and the first photoresist 191a and then to flat the second and first photoresist 191b and 191a in the real process (FIG. 4c). Then, the shape of the substrate is similar to FIG. 3c of the first bodiment. The next process is the same as that in the first embodiment.

Third Embodiment

Figure 5:
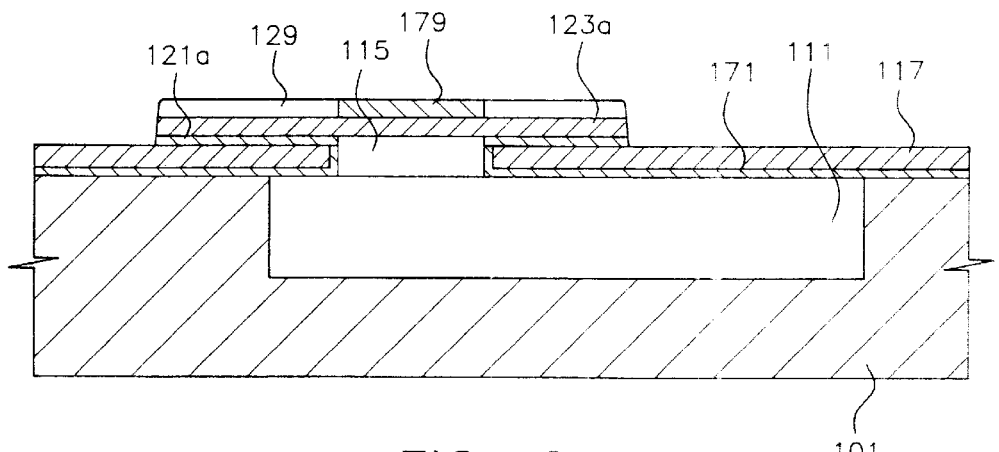
FIG. 5 is a cross-sectional view showing a method of manufacturing a silicon-germanium heterojunction bipolar transistor according to a third embodiment of the present invention.

In FIG. 3l of the first embodiment, if necessary, the third base semiconductor electrode 127 may be omitted. In this case, boron ion may be implanted in the second base semiconductor electrode 123a to serve as the third semiconductor electrode 127. And then, the base ohmic electrode 129 is formed on the second base semiconductor electrode 123a (FIG. 5). After that, the next process is the same as that in the first and second embodiment.

Fourth Embodiment

Figure 6A:
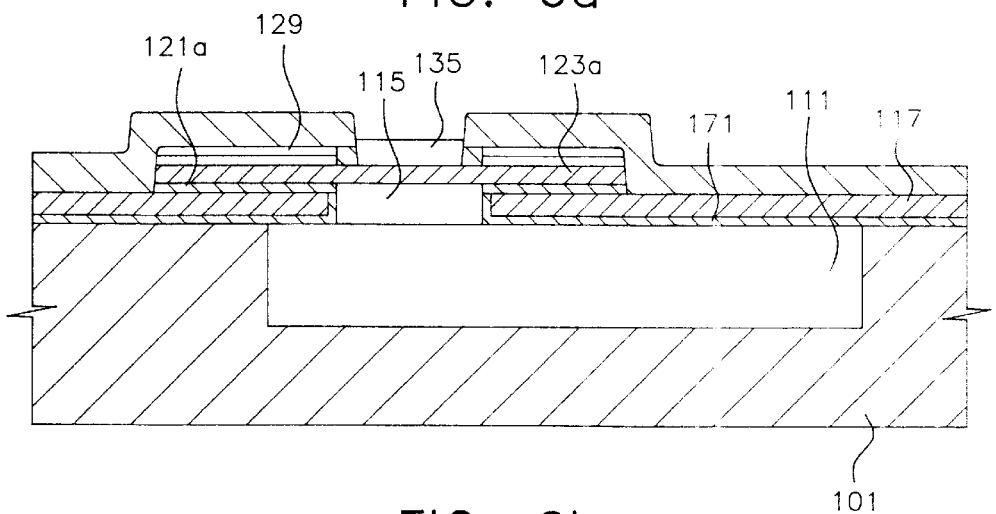
FIGS. 6a and 6b are cross-sectional views showing a method of manufacturing a silicon-germanium heterojunction bipolar transistor according to a fourth embodiment of the present invention.

In the first and second embodiment, as another method of manufacturing the emitter, the emitter dielectric film 137 and the masking film 179 are patterned to define the emitter area, as shown in FIG. 3m. Then, the n− type silicon selectively grows on the opened base to form the emitter 135 (FIG. 6a).

Figure 6B:
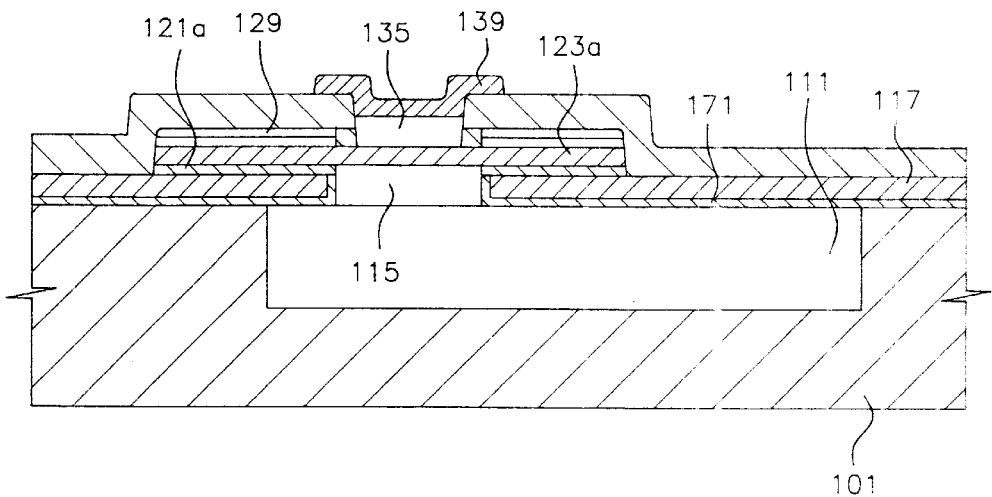

On the entire surface of the substrate on which the emitter 135 is formed, the n+ type polysilicon is deposited and patterned to form the emitter semiconductor electrode 139 (FIG. 6b). After that, the next process is the same as that in the first and second embodiment.

According to the present invention, the beak-shaped protrusion essentially formed in the locos method for defining the collector dielectric film (field oxide film) and the collector area by locally thermal-oxidizing a part of a semiconductor layer is prevented, thereby reducing a scale of the device. And, the problem of the leakage current due to the defect between the collector and the collector dielectric film generated in the seg method is prevented. Further, since the growing process of the base thin film is performed on the substrate the surface of which is covered by only the silicon, the loading effect is prevented. Therefore, the thickness of the thin film is formed to be uniform, thereby increasing a performance of the product. Although the preferred embodiment of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a bipolar device, comprising the steps of:
    (a) forming a substrate including a buried collector and a collector to be contacted with the buried collector, and the collector protruded in a form of an island;
    (b) depositing a collector dielectric film on a surface of the substrate on which the collector is protruding;
    (c) removing a protruded portion of the collector dielectric film covering the collector;
    (d) depositing a first semiconductor electrode layer on the substrate including the collector protruded over the collector dielectric film;
    (e) flatting a surface of the first semiconductor electrode to expose only the collector formed and the first semiconductor electrode; and
    (f) growing a base thin film including one of silicon and silicon-germanium on the substrate on which only the semiconductor material is exposed.

2. The method of claim 1, wherein the step (d) further comprises the steps of:
    (d-1) depositing the first semiconductor electrode layer and a silicon oxide film in order on the substrate including the collector protruded over the collector dielectric film;
    (d-2) removing a protruded portion of the silicon oxide film covering the substrate and the first semiconductor electrode layer to expose an upper face of the collector and then flatting the surface of the substrate;
    (d-3) oxidizing the protruded portion of the collector as deep as a thickness of the silicon oxide film; and
    (d-4) removing a thermal silicon oxide portion on the collector and the silicon oxide on the first semiconductor electrode layer to expose only the collector of the semiconductor material and the first semiconductor electrode layer.

3. The method of claim 1, further comprising the steps of:
    (g) patterning the base thin film and the first semiconductor electrode layer to define an area of an first and second base semiconductor electrode;
    (h) forming a masking film covering a base area contacted with the collector on the base thin film;
    (i) forming a base ohmic electrode on the second base semiconductor electrode exposed to an outer side of the masking film;
    (j) depositing an emitter dielectric film on the substrate on which the base ohmic electrode is formed and patterning the emitter dielectric film and the masking film to open an emitter area for exposing the base; and
    (k) forming an emitter contacted through the opened emitter area with the base.

4. The method of claim 3, further comprising the step of (1) growing a boron-doped semiconductor material on the second base semiconductor electrode exposed to the outer side of the masking film to form a third base semiconductor electrode, wherein the base ohmic electrode is formed on the third base semiconductor electrode.

5. The method of claim 1, wherein the bipolar device is a silicon-germanium heterojunction bipolar transistor.

* * * * *